United States Patent
Scalera et al.

(10) Patent No.: US 6,175,247 B1
(45) Date of Patent: Jan. 16, 2001

(54) CONTEXT SWITCHABLE FIELD PROGRAMMABLE GATE ARRAY WITH PUBLIC-PRIVATE ADDRESSABLE SHARING OF INTERMEDIATE DATA

(75) Inventors: Stephen M. Scalera, Amherst; Jose R. Vazquez, Nashua, both of NH (US)

(73) Assignee: Lockheed Martin Corporation, Nashua, NH (US)

( * ) Notice: Under 35 U.S.C. 154(b), the term of this patent shall be extended for 0 days.

(21) Appl. No.: 09/288,892

(22) Filed: Apr. 9, 1999

Related U.S. Application Data

(60) Provisional application No. 60/081,673, filed on Apr. 10, 1998.

(51) Int. Cl.$^7$ .............................. H03K 19/177; G06F 7/38
(52) U.S. Cl. ................................................. 326/39; 326/47
(58) Field of Search .................... 326/38, 39, 40, 326/41, 47

(56) References Cited

U.S. PATENT DOCUMENTS

| | | | |
|---|---|---|---|
| 4,125,869 | * 11/1978 | Gutmann | 326/40 |
| 4,914,322 | * 4/1990 | Win et al. | 326/40 |
| 5,081,375 | * 1/1992 | Pickett et al. | 326/41 |
| 5,381,058 | * 1/1995 | Britton et al. | 326/41 |
| 5,742,180 | * 4/1998 | DeHon et al. | 326/40 |
| 5,789,939 | * 8/1998 | Agrawal et al. | 326/41 |
| 5,915,123 | * 6/1999 | Mirsky et al. | 326/37 |

\* cited by examiner

Primary Examiner—Michael Tokar
Assistant Examiner—Steven S. Paik
(74) Attorney, Agent, or Firm—David W. Gomes; Gary D. Clapp

(57) ABSTRACT

A context switching logic cell with public and context private data sharing for use in a context switching system. A context switching logic cell includes a programmable logic unit using configuration bits for implementing programmable logic functions for each context, a context memory for storing and providing results of context dependent logic operations, and carry logic. The context memory includes private registers, public registers and an active register. Each private register corresponds to a context and is addressable only within the corresponding context while public registers are addressable within all contexts and the active register stores results of logic operations for the current context. A context switching logic cell may include a data memory that is accessible within all contexts. The context switching logic cells may be arranged into a context switching logic array for use in a context switching system by level 1 buses and carry bit lines. Logic arrays may be interconnected into pipelines by level 2 buses and bidirectional paths connecting sequentially adjacent logic array. A plurality of pipelines may be interconnected in parallel into a context switching system by a third level bus interconnecting the second level buses of the pipelines and carry lines between the corresponding context switching logic arrays of adjacent context switching pipelines.

10 Claims, 8 Drawing Sheets

CONTEXT SWITCHING SYSTEM 10 ions at any given time, with system operations switching among sets of circuits while currently unused circuits are reconfigured. In addition to increasing the complexity and cost of a system, these methods have, by there inherent nature, failed to provide a field programmable gate array based system or sub-system that can be reconfigured at a rate that exceeds the necessary persistence of a hardware function. In addition, the systems implemented by these methods have failed to provide a means whereby data may be shared between instantiations of the system hardware configurations, thereby further limiting the speed with which the hardware can be reconfigured because of the need to store and reload data at each change in the hardware configuration.

CONTEXT SWITCHABLE FIELD PROGRAMMABLE GATE ARRAY WITH PUBLIC-PRIVATE ADDRESSABLE SHARING OF INTERMEDIATE DATA

RELATED APPLICATIONS

The present application is a continuation of Provisional Patent Application 60/081,673 filed Apr. 10, 1998.

FIELD OF THE INVENTION

The present invention relates to field programmable gate array circuits and systems and, in particular, to context switchable field programmable gate array circuits and systems having publicly and privately shared data.

BACKGROUND OF THE INVENTION

Computer systems have historically evolved such that succeeding generations of computer systems have had progressively greater degrees of flexibility and adaptability. For example, the first computer systems, such as ENIAC, were characterized by fixed hardware and fixed software. That is, a given configuration of hardware and software were capable of performing only a single task and the reconfiguration of either the hardware or the software for a different task was a slow and difficult process. The next major evolutionary generation of computer systems, programmable mainframes, minicomputers and microprocessors, were characterized by fixed hardware and reconfigurable software and were thereby truly programmable, being capable of storing and executing a variety of programs for different tasks.

The current generation of computer systems now includes systems utilizing field programmable gate arrays, that is, hardware comprised of dynamically reconfigurable arrays of basic functional elements, so that these systems are characterized by reconfigurable hardware as well as reconfigurable software. Systems employing field programmable gate arrays are and have been used in applications that demand the performance achieved by application specific circuits and provide the flexibility to adapt from one application to another without the installation of new, application specific hardware for each application. Field programmable gate arrays also allow systems to be upgraded or modified in accordance with rapid design cycles as a hardware reconfiguration requires only the reprogramming of the gate arrays rather than the replacement of a fixed hardware configuration.

Although current field programmable gate arrays have proven adequate and acceptable for many applications, a persistent limitation of current field programmable gate arrays is the time required to reprogram, or reconfigure, current gate arrays from one configuration to another. In the present state of the art, the reconfiguration of a field programmable gate array requires several milliseconds, and as such the reconfiguration time is much longer than the times typically required to complete processes in current computer systems. This limitation thereby prevents computer systems implemented in field programmable gate arrays from achieving run time reconfiguration, that is, the dynamic reconfiguration of system hardware during the execution of a sequence of operations so that the system hardware is optimally configured for each operation.

The prior art has attempted to deal with this limitation by the partial reconfiguration of only selected portions of the field programmable gate array elements and by the use of additional circuits, in excess of those required for system operations at any given time, with system operations switching among sets of circuits while currently unused circuits are reconfigured. In addition to increasing the complexity and cost of a system, these methods have, by there inherent nature, failed to provide a field programmable gate array based system or sub-system that can be reconfigured at a rate that exceeds the necessary persistence of a hardware function. In addition, the systems implemented by these methods have failed to provide a means whereby data may be shared between instantiations of the system hardware configurations, thereby further limiting the speed with which the hardware can be reconfigured because of the need to store and reload data at each change in the hardware configuration.

The present invention provides a solution to these and other problems of the prior art.

SUMMARY OF THE INVENTION

The present invention is directed to a context switching logic cell with data sharing for use in a context switching system.

According to the present invention, a context switching logic cell includes a a programmable logic unit and a context memory. The programmable logic unit is connected from an address/data input for implementing at least one programmable logic function for each context. In the presently preferred embodiment, the programmable logic unit is comprised of a function control memory connected from an address/data input for storing a plurality of sets of configuration bits, each set of configuration bits corresponding to one of a corresponding plurality of contexts and implementing at least one programmable logic function for the corresponding context.

The context memory is connected from the function control memory and includes a plurality of registers, or flip-flops, for storing and providing as an output the results of context dependent logic operations. The context memory registers include a plurality of private registers, at least one public register and an active register. Each private register corresponds to a context and is addressable only within the corresponding context for storing and providing as outputs the results of logic operations in the corresponding contexts. Public registers are addressable within all contexts for storing and providing as outputs the results of logic operations within all contexts, and the active register stores and provides as an output the results of logic operations for the current context.

A context switching logic cell also includes carry logic for receiving a carry bit and generating a carry bit output dependent upon the received carry bit and a current logic operation and may include a data memory that is accessible within all contexts for receiving and storing data and providing a data output to the active register.

Further according to the present invention, the context switching logic cells may be arranged into a context switching logic array for use in a context switching system. A context switching logic array includes a plurality of context switching logic cells arranged in parallel to perform n bit logic operations wherein n is the number of context switching logic cells in the context switching logic array. A context switching logic array further includes a first level bus and dedicated carry bit lines. The first level bus interconnects the address/data inputs and result outputs of the plurality of context switching logic cells into the context switching logic array and provides address/data inputs and result outputs for the context switching logic array. There is a dedicated carry line for and corresponding to each context switching logic cell for communicating carry bits between the context switching logic cells.

Still further according to the present invention, the context switching logic arrays may be arranged into one or more context switching pipelines for use in a context switching system. Each pipeline includes a plurality of context switching logic arrays arranged in series to perform n bit pipelined operations and a second level bus for interconnecting the address/data inputs and result outputs of the context switching logic arrays into the context switching pipeline and to provide address/data inputs and result outputs for the context switching pipeline. Each pipeline will also include, for each context switching logic cell in each context switching array, first and second output interconnections for providing a corresponding output of a corresponding context switching logic cell to inputs of corresponding context switching logic cells in sequentially adjacent context switching logic arrays.

Finally, and according to the present invention, a context switching system may include a plurality of context switching pipelines arranged in parallel, a third level bus for interconnecting the second level buses of the context switching pipelines, dedicated carry lines for and corresponding to each context switching logic array for communicating carry bits between the corresponding context switching logic arrays of the adjacent context switching pipelines.

DESCRIPTION OF THE DRAWINGS

The foregoing and other objects, features and advantages of the present invention will be apparent from the following description of the invention and embodiments thereof, as illustrated in the accompanying figures, wherein.

DESCRIPTION OF THE INVENTION

As will be described in detail in the following, the present invention allows the construction of a computer system having a context switching reconfigurable (CSR) architecture. As will be described, in a context switching reconfigurable computing system the system logic circuits are reconfigured to different functions during the system run time, and data may be shared between instantiations of different hardware configurations. The following will first described the principles and operational features and advantages of CSR architectures and computing, and will then describe a CSR system and the CSR logic circuits of the present invention in detail, starting at system level and proceeding to the detailed logic circuit level.

Figure 1:
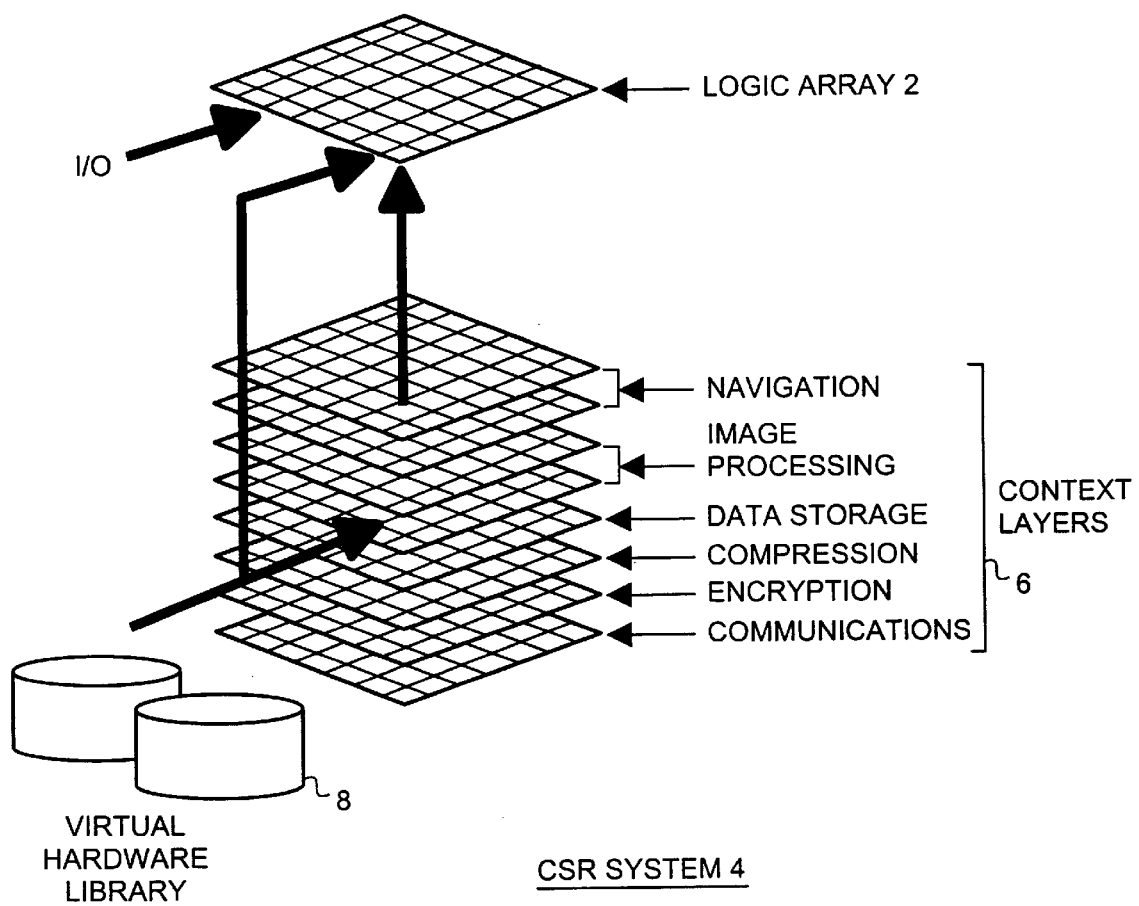
FIG. 1 is a diagrammatic representation of an exemplary context switchable system.

1. Introduction—General Discussion of Context Switching Reconfiguraable Systems with Data Sharing (FIG. 1)

As will be described, a CSR architecture system of the present invention is implemented by means of dynamically reconfigurable field programmable gate array (FPGA) circuits implemented according to the present invention. In this regard, the reconfigurable FPGA circuits of the present invention are completely reconfigurable at a rate greatly exceeding the necessary persistence of a given hardware configuration, that is, essentially at the clock rate of the computer system. The FPGA circuits of the present invention may thereby be reconfigured at a rate that allows complete reconfiguration of the system circuits during the run time of operations by a computer system. As such, the system hardware may be reconfigured from operation to operation so that the system hardware is optimally configured for each operation of a sequence of operations. In the present implementation of the invention, the FPGA circuits allow reconfiguration between a number of programmed functions wherein each configuration is referred to herein as a "context". In addition, and although the FPGA circuits of the prior art were capable of switching contexts and of sharing data among contexts, the FPGA circuits of the prior art were not capable of discriminating between contexts when sharing data and thereby allowed the sharing only of data that was publically accessible to all contexts. The CSR circuits of the present invention, however, are capable of discriminating between contexts, and allow data to be identified and retained as private to a given context.

The CSR architecture and circuits of the present invention may be considered as providing a fixed-hardware/fixed software computer system during each context, that is, during the existence of each instantiation of a configuration, and dynamic reconfiguration at real time operation rates among selectable, programmed configurations, each of which may perform a different function. The present invention, whereby the hardware and software that is instantiated in a system at any instant is determined by switchable contexts and is the hardware and software necessary to perform the function required at that time, thereby embodies the concept of "virtual hardware", that is, hardware that is dynamically reconfigurable to perform any desired function. In this regard, and for example, a CSR system constructed according to the present invention may include a high level system scheduler to instantiate hardware as needed by switching appropriate contexts in and out of the CSR circuits.

One consequence of the CSR architecture and circuits of the present invention is that, because configurations can be swapped in and out of the gate array circuitry of the present invention at the real time system rate, hardware functions can be created and disposed of as needed and only the hardware actually required at a given instant need be instantiated at that instant. The size, cost and power requirements of a system can therefore be reduced as the system is required to include only the gate array circuitry necessary for the largest context, or configuration, to be instantiated at any given time. In addition, and for the same reasons, the functions that may be implemented in a system are not restricted by the available hardware, so that a system may implement algorithms, algorithm caches or coprocessors of essentially unlimited size and complexity by implementing, at any instant and by loading the appropriate context or contexts, only those portions of the total logic circuitry required at the time.

In addition, if in a given application the processing operations require the sequential application, or execution, of algorithms, the capability of the present CSR architecture to share data between contexts allows an algorithm cache mode of operation. In this type of operation, the contexts of a CSR system are sequentially arranged to share data so that the output of one algorithm is immediately available as an input to the next algorithm upon the context switch between the algorithms. The CSR architecture may therefore be viewed as providing a new model for data processing or computing wherein the data processing algorithms are "passed through the data", in contrast to the convention model of computing and data processing wherein the data is passed through successive algorithms.

In an extension of the algorithm cache mode of CSR operation, for example, referred to herein as "mission phase reprogrammability" and illustrated by an example in FIG. 1, an entire mission, that is, sequence of operations, is mapped into a Logic Array 2 of a CSR System 4 as Context Layers 6, which may be stored in and read from a Virtual Hardware Library 8. Each Context Layer 6 contains one or more contexts and the different contexts in the layers contain different algorithmic phases of the mission, but without requiring that an algorithm be confined to a single context, so that a given algorithm may extend over two or more contexts. It will be seen, for example, that the CSR architecture, wherein data may be shared and passed among successive contexts, is readily adapted to improved signal processing algorithms which require the sequential passing of data resulting from successive algorithm operations from one algorithm to the next.

Further in this regard, and as will be apparent after the following descriptions, a number of contexts can be concurrently instantiated in a CSR system such by loading different contexts into corresponding regions of the CSR gate array circuitry. As such, and subject only to the limitation that a current context should not be dependent upon data resulting from another current context, the CSR architecture of the present invention is well adapted to parallel processing, that is, the concurrent execution of multiple processes.

2. Description of a CSR System and Context Switching Logic of the Present Invention (FIGS. 2, 3, 4 and 5)

A primary application for field programmable gate array (FPGA) logic is the implementation of data processing algorithms or processes with deep pipelines, that is, processes having a large number of sequential operations wherein the data is passed from operation to operation. Pure dataflow algorithms are rare, however, and the integration of FPGA circuitry into systems typically requires that FPGA circuits also be used to implement pipeline control signals, state machines, and interface circuits to, for example, external RAM (random access memory), external devices and other system circuits. For this reason, and as will be described in the following, the CSR logic circuits of the present invention are, in a presently preferred embodiment, designed as a pipeline dataflow engines having a width, for example, of 4 bits, that is simultaneously capable of efficiently implementing logic functions. Because system performance enhancements obtained through the use of FPGA circuits are frequently achieved by implementing the FPGA circuits for the minimum required bit width, the FPGA circuits of the presently preferred embodiment are designed to allow users to implement scaleable pipelines having any desired word width, such as 4, 8, 16, 32, 64 or more bits.

A. Data Pipes (FIGS. 2 and 4)

Figure 2:
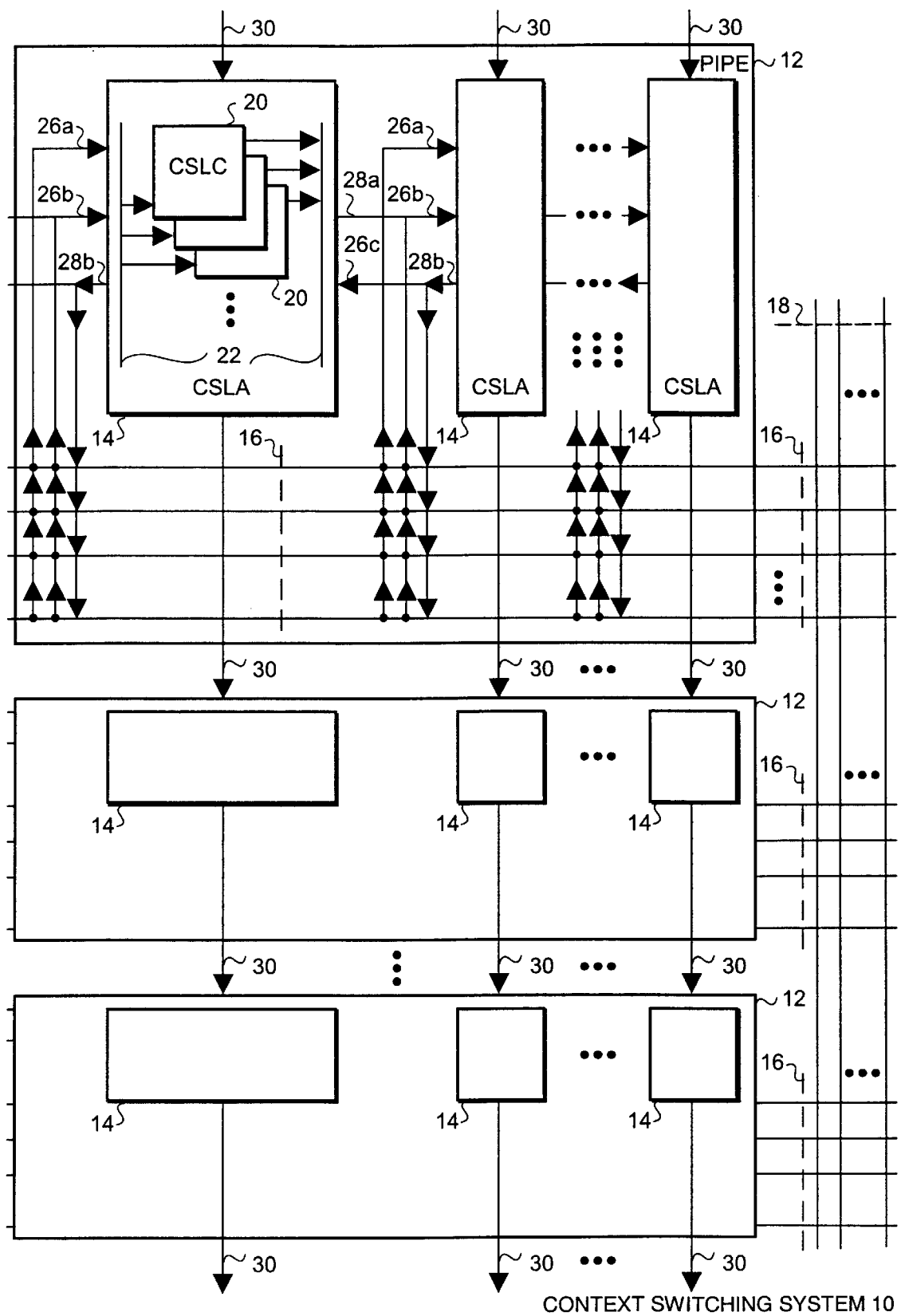
FIG. 2 is a representation of a pipelined system utilizing context switchable gate arrays and logic cells and the bus interconnections between cells, arrays and pipelines.

A presently preferred embodiment of the present invention is illustrated in FIG. 2 wherein it is shown that the CSR devices of the present invention, which will be described in detail in a following discussion, may be arranged as a Context Switching System 10 that includes one or more Data Pipes 12. As shown, each Data Pipe 12 is comprised of a plurality of Context Switching Logic Arrays (CSLAs) 14 interconnected in a pipe configuration by a Level 2 Routing Bus (Level 2 Bus) 16 and a plurality of Data Pipes 12 may be interconnected in parallel to form a Processor Pipe 10 through a Level 3 Routing Bus (Level 3 Bus) 18 interconnecting their Level 2 Buses 16. Each CSLA 14 is in turn comprised of a plurality of Context Switching Logic Cells (CSLCs) 20, that is, the 4 bit dataflow engine CSR devices referred to herein above and described in detail in a following discussion. The CSLCs 20 are interconnected within each CSLA 14 through a Level 1 Routing Bus (Level 1 Bus) 22, which interconnects with the CSLA 14's Level 2 Bus 16.

In the presently exemplary embodiment each Data Pipe 12 is 16 bits wide, so that each CSLA 14 correspondingly contains 16 CSLCs 20 and is capable of processing 2 16 bit words and generating a 16 bit output result. It will be understood, in this respect, that wider or narrower Data Pipes 12 may be constructed by increasing or decreasing the number of CSLCs 20 in each CSLA 14. It will also be understood that the width of a Processor Pipe 10 is determined by the number of Data Pipes 12 arranged in parallel and interconnected through a Level 3 Bus 18, so that any width of Processor Pipe 10 may be readily constructed.

Figure 4:
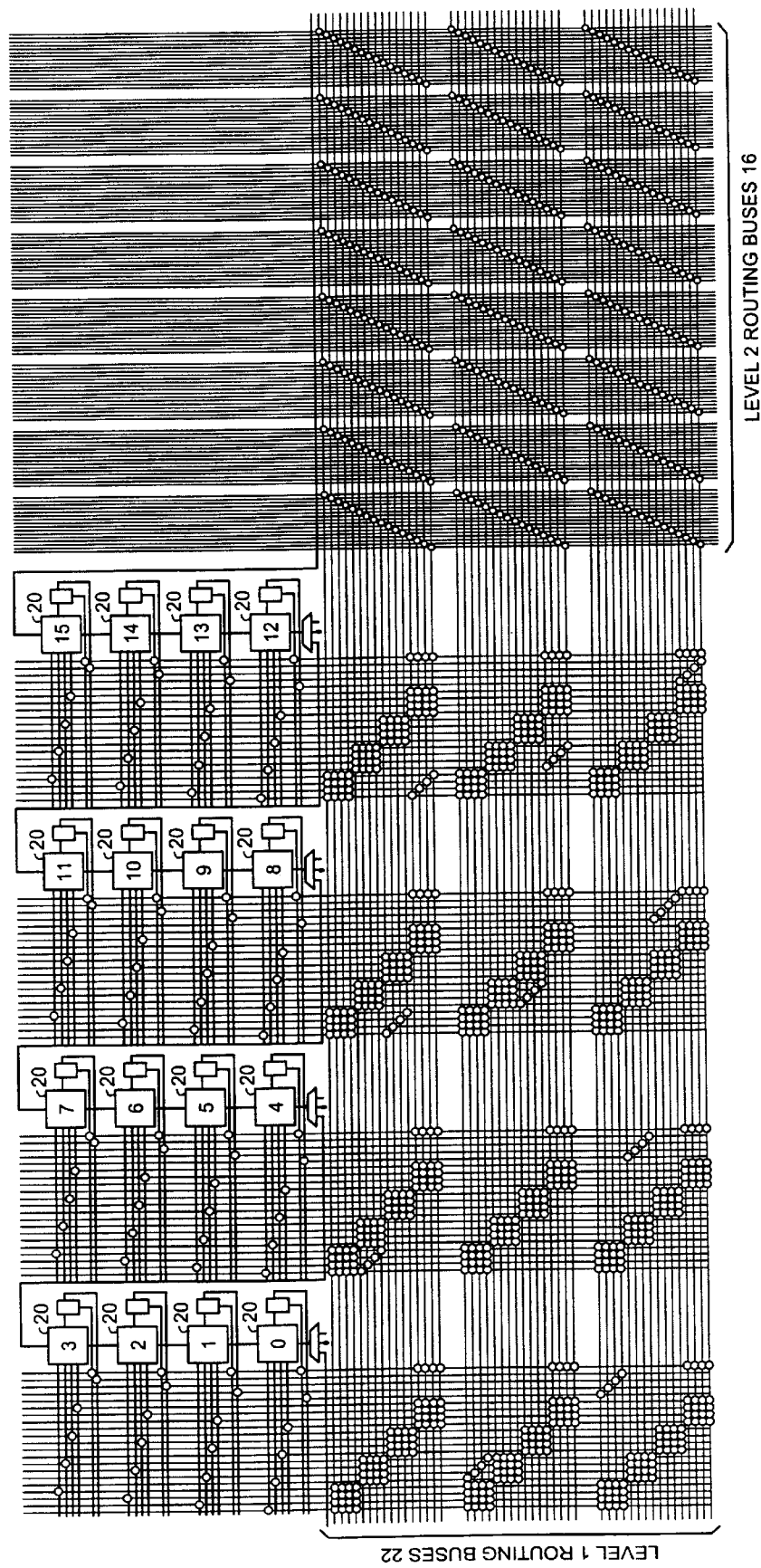
FIG. 4 is a diagrammatic illustration of level 1 and level 2 bus interconnections.

Referring now to CSLAs 14 and a Level 2 Bus 16, as illustrated in FIGS. 2 and 4 and as will be discussed further in a following discussion pertaining to FIG. 4, each Level 2 Bus 16 is comprised of a plurality M of Sub-Buses 16m wherein each Sub-Bus 16m is comprised of N single bit data Lines 24n. In the present embodiment, for example, a Level 2 Bus 16 is comprised of 6 Sub-Buses 16m and each Sub-Bus 16m is comprised of 16 single bit data Lines 24n. Each Level 2 Bus 16 runs the "length" of its Data Pipe 12 to interconnect with each of the CSLAs 14 of the Data Pipe 12 and is not segmented, that is, is a single, unitary bus interconnecting the CSLAs 14, and a signal driven onto a Level 2 Bus 16 is available to any CSLA 14 connected from the Level 2 Bus 16 in the Data Pipe 12.

As shown in FIG. 2, each CSLA 14 has three 16 bit Inputs 26a, 26b and 26c and a 16 bit Output 28 that is branched into two outputs, respectively designated as Outputs 28a and 28b. As indicated therein, each bit of Input 26a and each bit of Input 26b is connected from the Line 24n or Lines 24n of the corresponding bits of the Level 2 Bus 16 and each bit of Output 28a is connected to the Line 24n or Lines 24n of a corresponding bit of the Level 2 Bus 16. Each bit of Input 26b is additionally connected from a corresponding bit of the Output 28a of a first adjacent CSLA 14 of the Data Pipe 12 and each bit of Input 26c, in turn, is connected from a corresponding bit of the Output 28b of the other adjacent CSLA 14 of the Data Pipe 12.

Each CSLA 14 is therefore provided with two sets of input/output connections, each comprised of two 16 bit inputs and a 16 bit output, and two corresponding data paths, which may be referred to as the Level 2 data path and the inter-CSLA data path, through which each CSLA 14 may transmit or receive data. The first set of input/output connections, to and from and the Level 2 data path, allows each CSLA 14 to communicate with every other CSLA 14 of the Data Pipe 12, and, by means of the Level 2 Bus 16 interconnections through a Level 3 Bus 18, with the CSLAs 14 of other Data Pipes 12. The second set of input/output connections, to and from the inter-CSLA data path, is interconnected with the inputs and outputs of the two adjacent CSLAs 14, thereby allowing bidirectional pipeline transfers of data between adjacent CSLAs 14 and along the Data Pipe 12. In this regard, it must be noted that Outputs 28a and 28b are functionally the same output, which is branched to inputs of the preceding and succeeding CLSAs 14 and are shown in FIG. 2 as two outputs for clarity in representing these connections from each CSLA 14 to the preceding and following CSLAs 14 of Data Pipe 12. In a like manner, Inputs 26b and 26c are functionally the same input, but are again represented in FIG. 2 as two inputs for clarity in shown the bus interconnections.

First considering the Level 2 data path, each CSLA 14's data output to the Level 2 Bus 16 can drive any one or any combination of the Lines 24n of Level 2 Bus 16 and the Level 2 Bus 16 may be used as a 16 bit wide data bus, or as individual data lines, or in any combination of data lines or sub-buses comprised of the data lines.

Next considering the inter-CSLA data paths, the input/output connections between adjacent CSLAs 14 allows data to easily flow along a Data Pipe 12 from one end of the Data Pipe 12 to another, in either direction along the Data Pipe 12, so that each Data Pipe 12 to be used as a bidirectional data path in itself. This feature in turn is of significant utility when sharing data among contexts. For example, a first context could process data in direction along a Data Pipe 12 and store its final result in the registers, described in a following discussion, at one end of the Data Pipe 12, or in fact at any intermediate location along the Data Pipe 12. A next context may then start with the data resulting from the first context, which may be, for example, an intermediate result of an algorithm, by acquiring the stored data deposited by the first context and process the data along the Data Pipe 12 in the opposite direction, or in continuation in the same direction along the Data Pipe 12. It will therefore be apparent that the data path provided along a Data Pipe 12 between the CSLAs 14 of the Data Pipe 12 may be more efficient than conventional techniques, wherein intermediate data must be stored separately from the processing data path, by alleviating the need to reroute data from its physical location, that is, the need to store and recover data from a separate location.

Lastly, it has been described above that a plurality of Data Pipes 12 may be arranged in parallel and interconnected by means of Level 3 Bus 18 connections to the Level 2 Buses 16 of the Data Pipes 12. As shown, Level 3 Bus 18 extends the width of the Data Pipes 12 of a Processor Pipe 10 and, like Level 2 Bus 16, Level 3 Buses 18 are not segmented. As may be seen from FIG. 2, information driven onto a Data Pipe 12's Level 2 Bus 16 by any CSLA 14 of that Data Pipe 12 can be routed through Level 3 Bus 18 to the corresponding Lines 24n of the Level 2 Bus 16 of another Data Pipe 12 and thereby to any of the CSLAs 14 of the other Data Pipe 12.

Lastly with respect to interconnections and data paths between CSLAs 14 and Data Pipes 12, it will be noted that, as shown in FIG. 2, CSLAs 14 are provided with dedicated Carry Paths 30 wherein the carry bits generated by the CSLAs 14 of a Data Pipe 12 may be passed to the carry bit inputs of corresponding CSLAs 14 of adjacent Data Pipes 12. This feature allows adjacent Data Pipes 12 to be interconnected, or bundled together to form a single Data Path 12, or a Processor Pipe 10, having a data path width equal to the data path widths of the interconnected Data Pipes 12. In exemplary embodiment of FIG. 2, for example, each Data Pipe 12 is 16 bits wide and Carry Paths 30 allows the construction of Data Pipes 12, or Processors Pipes 10, having a width that is a multiple of 16 bits, such as 32, 48 or 64 bits. It will also be noted in this regard that, as described above, each Data Pipe 12 may be functionally subdivided into two or more smaller Data Pipes 12. For example, in the present embodiment the design of CSLCs 20 and CSLAs 14 is optimized to allow Data Pipes 12 to be subdivided into pipes having widths of one or more 4 bit "nibbles".

Figure 3:
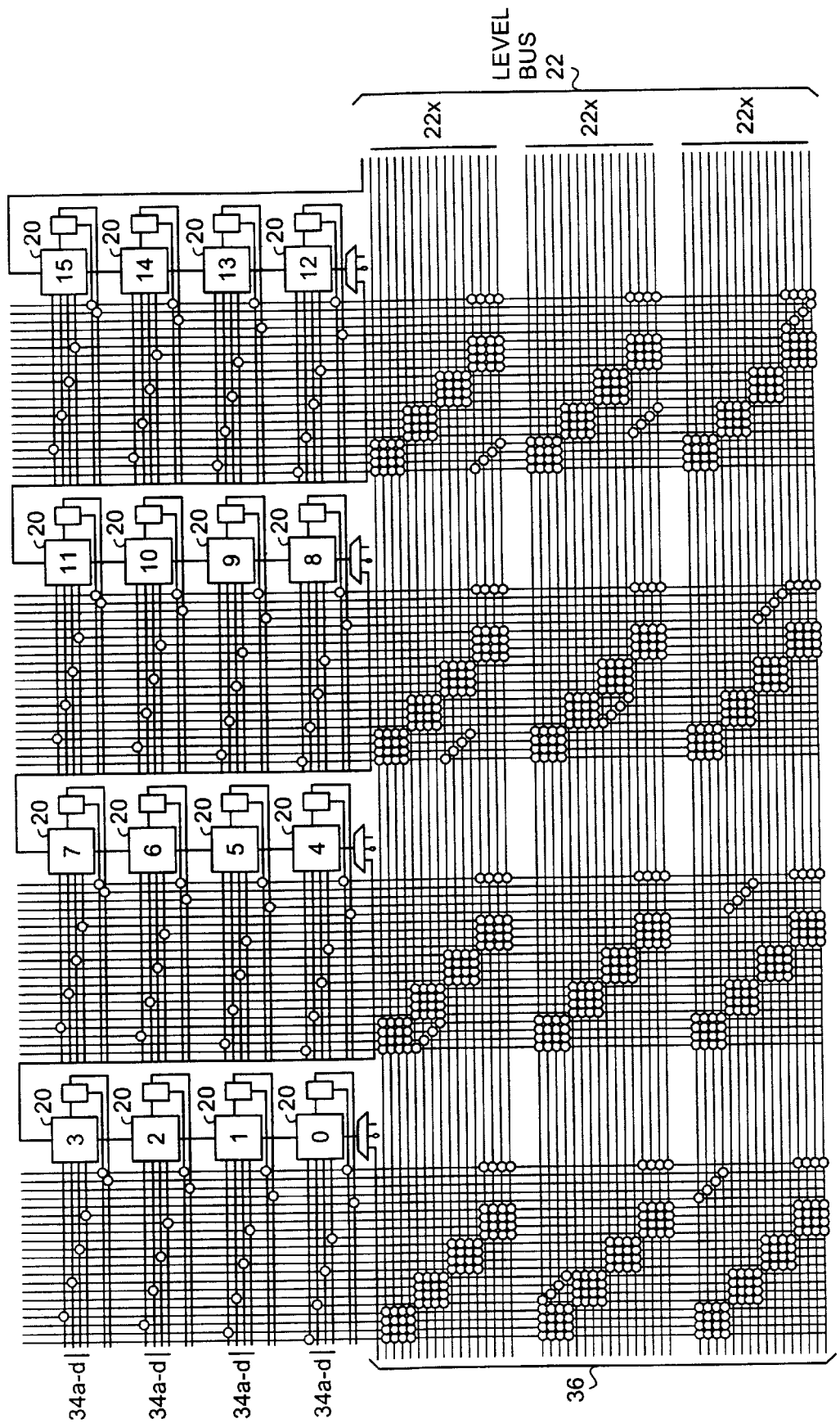
FIG. 3 is a diagrammatic illustration of level 1 bus interconnections.

B. Routing Modes of Operation (FIGS. 3 and 4)

As described above, the CSLCs 20 and CSLAs 14 of the presently preferred embodiment are designed to implement both pipelined data processing algorithms or processes and random logic functions such as control logic, state machines, and interface circuits. In order to meet these requirements, the CSLCs 20 and CSLAs 14 of the present invention support two types, or modes, or data routing, which may be referred to as bus routing and bitwise routing.

1. Bus Routing (FIGS. 3 and 4)

Bus routing is provided to allow entire words having a width equal to the word width of Data Pipes 12, that is, 16 bits in the present embodiment, to be routed into and out of CSLAs 14 while maintaining bitwidth order in the words, that is, to maintaining the most significant bit in the most significant bit position, the least significant bit in the least significant bit position, and so on.

Referring to FIGS. 3 and 4, FIG. 3 illustrates the arrangement and interconnections of CSLCs 20 and Level 1 Bus 22 in a CSLA 14 while FIG. 4 illustrates the arrangement and interconnections of CSLCs 20, Level 1 Bus 22 and Level 2 Bus 16 in a CSLA 14. As shown and as described above, a CSLA 14 of the present embodiment contains 16 CSLCs 20 arranged in parallel to form a 16 bit wide logic element and includes with such additional elements, such as Carry Drivers 32, as are necessary to interconnect the elements thereof for appropriate operation.

As shown in FIGS. 3 and 4, each CSLC 20 is provided with four data inputs 34, which may be referred to as Inputs 34a, 34b, 34c and 34d, while Level 1 Bus 22 is comprised of a plurality X of Sub-Buses 22x wherein each Sub-Bus 22x is comprised Y single bit data Lines 36y. In the present embodiment and for example, there are three Sub-Buses 22x and each SubBus 22x is 16 bits wide, that is, is comprised of 16 Lines 36y.

The interconnections between Inputs 34a, 34b 34c and 34d and the Lines 36y of Level I Bus 22 are programmable, by control of CSLCs 20 and through CSBits 42 as described, and are sufficient to ensure that at least one of Sub-Buses 22x can be routed to, for example, the Input 34a of each of the CSLCs 20 of a CSLA 14, so that, and for example, the least significant of the Sub-Bus 22x can be routed to the least significant CSLC 20, and so on. Stated another way, that Sub-Bus 22x may be considered to be the 16 bit wide A input to the entire CSLA 14, that is, can route data to the Inputs 34a of all of the CSLCs 20 of the CSLA 14. The second Sub-Bus 22x may then be used in a like manner as the 16 bit wide B input to the CSLA 14, that is, to the Inputs 34b of the CSLCs 20. The Lines 36y of the third Sub-Bus 22x are connected to Outputs 38, see FIG. 5a, of the CSLCs 20 and connect to the Level 2 Bus 16 for routing through the Level 2 Bus 16. The third Sub-Bus 22x also provides the previously described bidirectional connections to adjacent CSLAs 14 to allow fast routing between CSLAs 14 by alleviating the need for Level 2 Bus 16 routing when the output of a CSLC 20 is being routed to an adjacent CSLA 14.

2. Bitwise Routing

Bitwise routing is provided for the implementation of random logic functions, such as control logic, state machines and interface logic. In this mode of operation, the Output 38 of any CSLC 20 in a CSLA 14 is provided with at least one possible path to connect to at least one Input 34 of all other CSLCs 20 in the CSLA 14. For this reason, all of the A inputs, that is, Inputs 34a, of all CSLCs 20 in a CSLA 14 can receive the four least significant bits of the three Sub-Buses 22x of Level 1 Bus 22, including the Sub-Bus 22x connected from Outputs 38, thereby allowing local feedback without having to use Level 2 Bus 16 routing. Similarly, the B inputs, Inputs 34b, the C inputs, Inputs 34c, and the D inputs, Inputs 34d, of each CSLC 20 are connected, respectively, to successively higher order four bit groups of Lines 36, with Inputs 34d being connected to the highest order four bits of Lines 36 of the three Sub-Buses 22x. As a consequence, the four least significant CSLCs 20, whose outputs drive the corresponding four least significant bits of the output Sub-Bus 22x, that is, the output Sub-Bus 22x, are capable of driving any Input 34a of any CSLC 20 within the CSLA 14, the four next most significant CSLCs 20 are capable of driving any Input 34b of any CSLC 20 within the CSLA 14, and so on. Furthermore, and because the connections between Level 1 Bus 22 and Level 2 Bus 16 maintain bit order, and because the connections between Level 2 Bus 16 and Level 3 Bus 18 maintain bit order, the four least significant CSLCs 20 of any CSLA 14 can drive the Input 34a of the CSLCs 20 of any other CSLA 14, and so on.

Finally, each CSLC 20 has a clock enable input and a control line input that selects whether PLU 40 or CSRam 44, described below, is active.

C. Context Switching Logic Cells (CSLCs) 20 (FIGS. 5a, 5b and 5c)

Figure 5A:
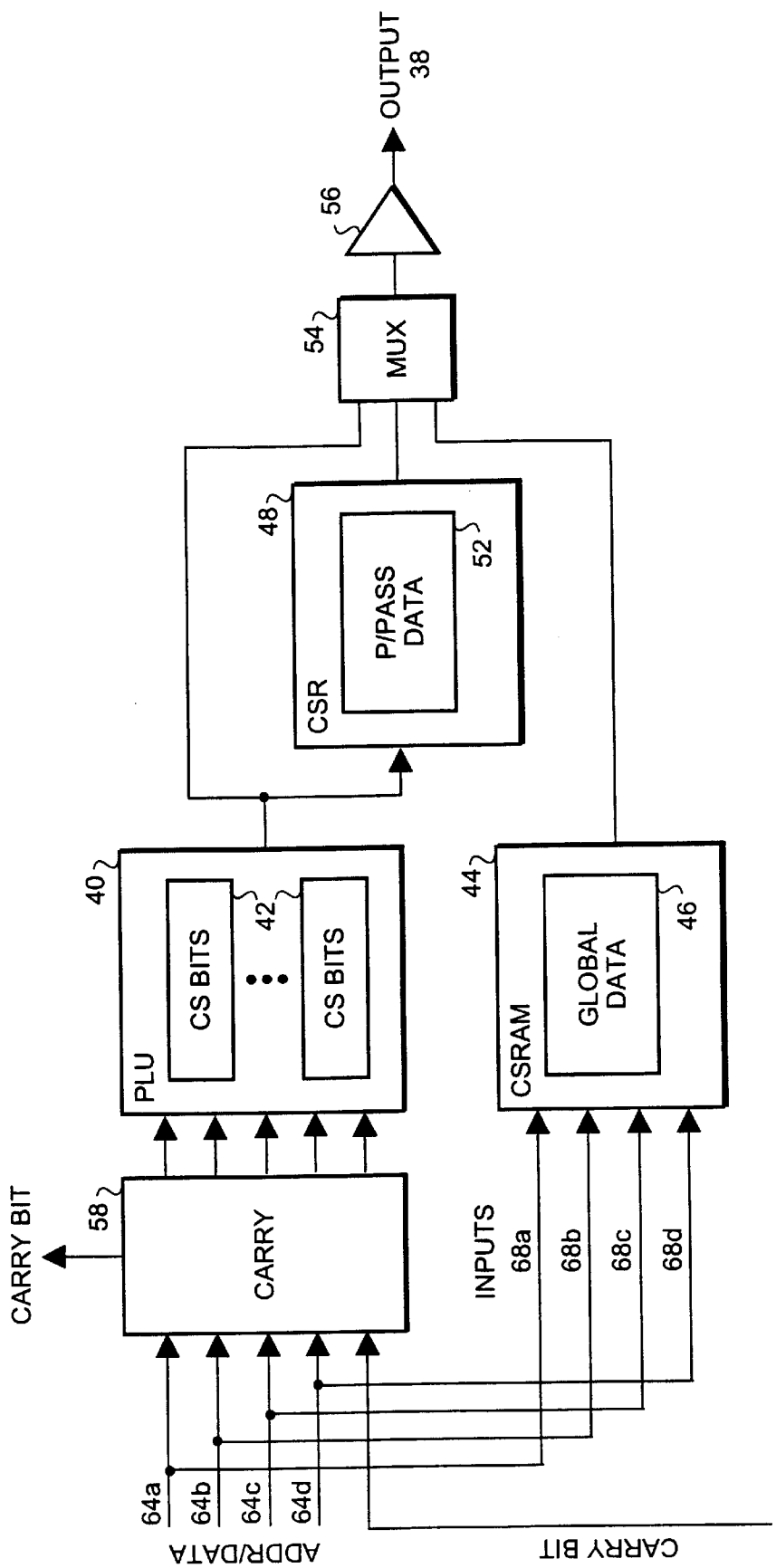
FIG. 5a is a block diagram representation of a context switching logic cell of the present invention.

Referring to FIG. 5a, therein is shown a block diagram of a CSLC 20 of the present invention. As shown therein, a CSLC 20 includes a Programmable Logic Unit (PLU) 40 for implementing programmable logic functions for one or more contexts, the logic functions being represented and determined by Context Switching Configuration Bits (CSBits) 42, and a Context Switching Random Access Memory (CSRam) 44 for storing Global Data 46. Each CSLC 20 also includes Context Switching Register (CSR) 48 having a data input connected from the output of PLU 40 for storing Public/Private Addressable (P/PASS) Data 52. Each CSLC 20 further includes a Multiplexer (MUX) 54 that allows the Output 38 of the CSLC 20 to be selected from the outputs of CSR 48, PLU 40 or CSRam 44, and a Tri-State Buffer 56 connected between the output of MUX 54 and Output 38. As will be discussed further below, each CSLC 20 also include a Carry Logic (Carry) 58.

Figure 5B:
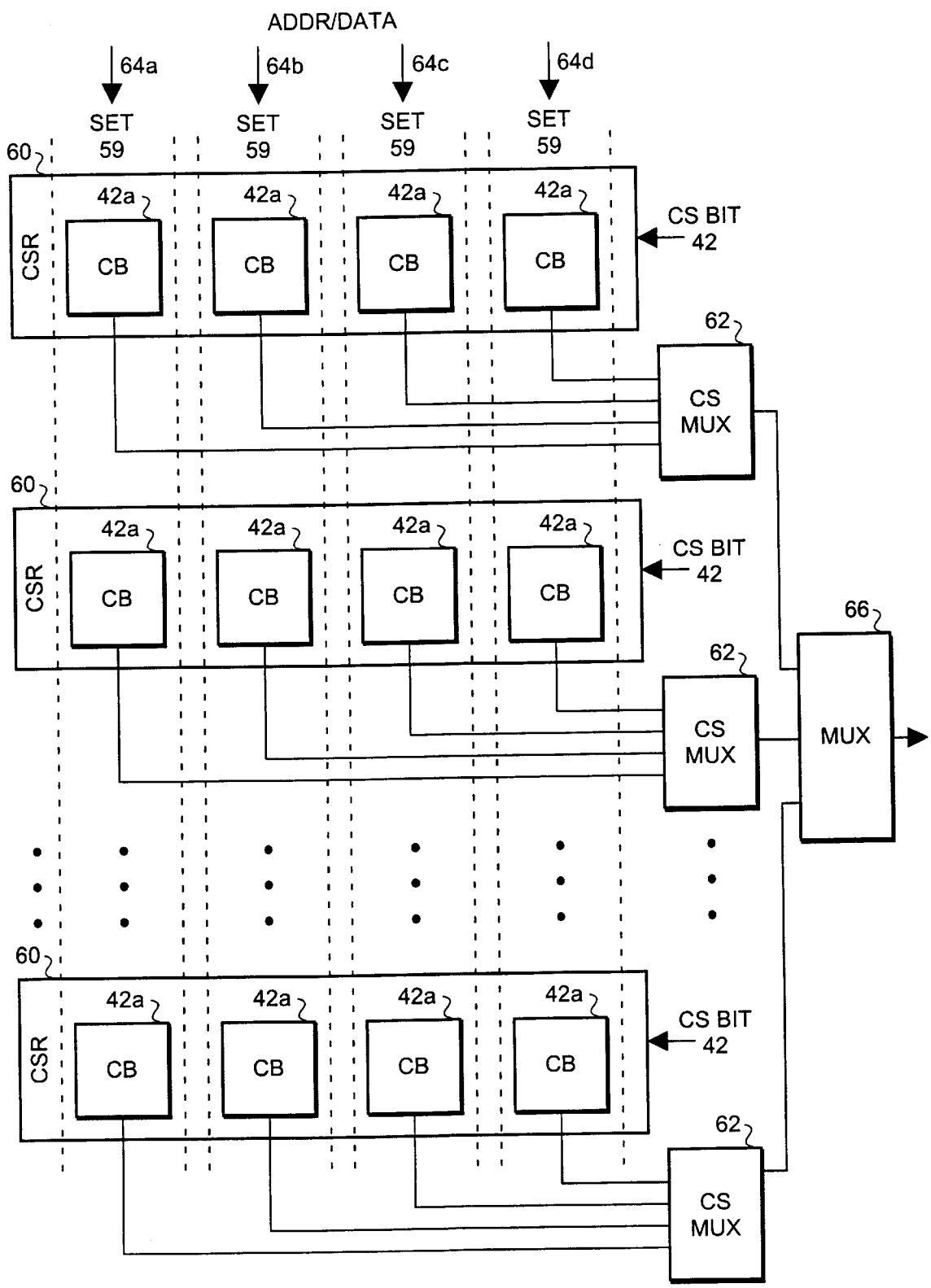
FIG. 5b is a block diagram of a logic cell lookup table for storing context configurations.
Figure 5C:
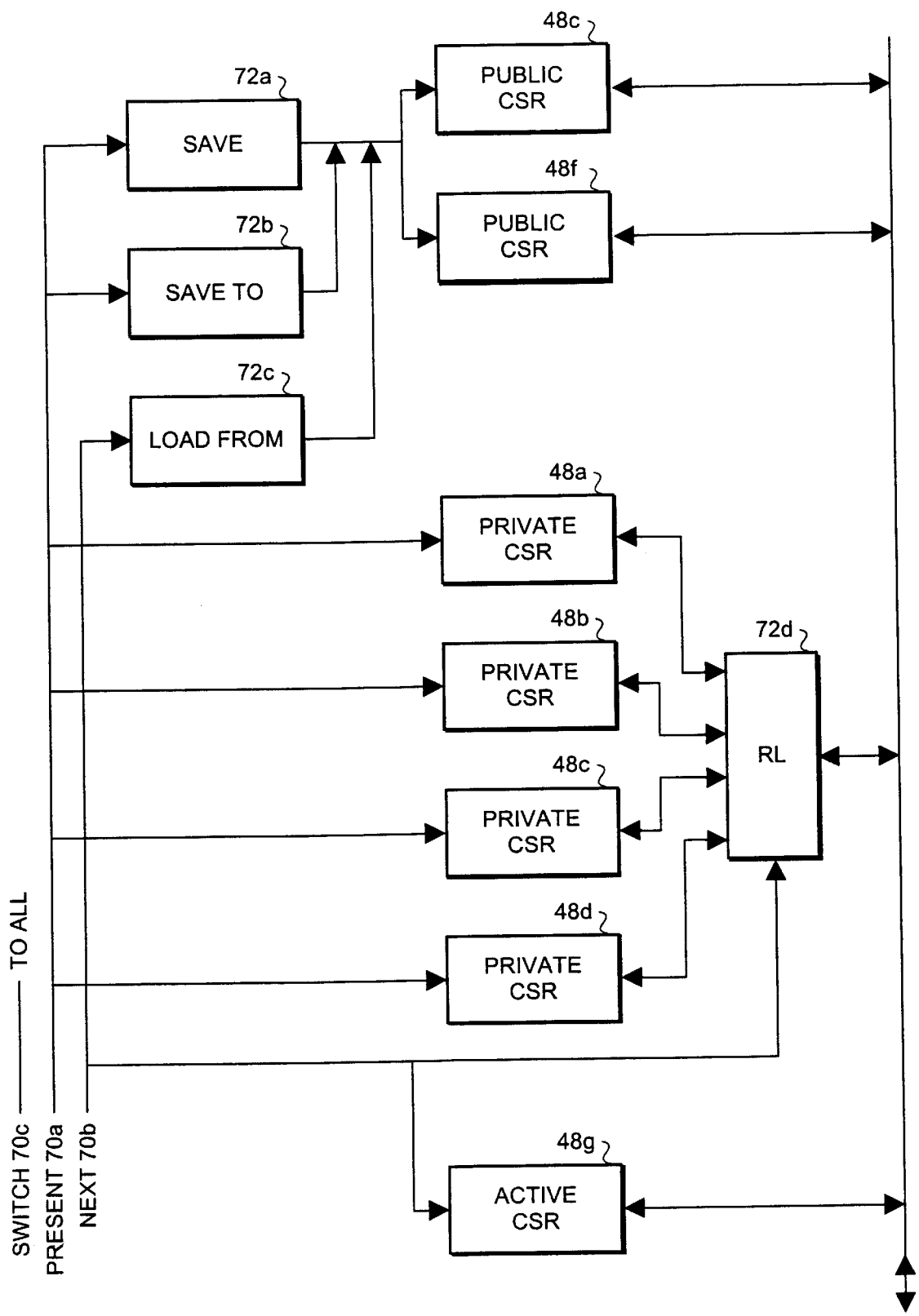
FIG. 5c is a block diagram of the public/private/active data sharing registers of the present invention.

In the present embodiment and as illustrated in FIG. 5b, PLU 40 is implemented as a truth table memory capable of storing CSBits 42 for four contexts and stores a Configuration Set (Set) 59 of 16 configuration bits for each of the contexts. Each CSBit 42 is comprised of 4 Configuration Bits (CBs) 42a wherein each of the configuration bits in a given CSBit 42 corresponds to one of the four possible contexts and wherein 16 CSBits 42 thereby define a four bit wide by 16 bit long configuration bit table comprised of the configuration bits for each of the four possible contexts. As shown in FIG. 5b, PLU 40 is functionally comprised of 16 four bit CS Registers (CSRs) 60 wherein each CS Register 60 stores the four configuration bits of a CSBit 42 and wherein there is a CS Multiplexer (CSMUX) 62 associated with each CS Register 60 which is driven by the current context to allow the configuration bit of the current configuration to be selected and read from each CS Register 60. The configuration bits read from CS Registers 60 are provided to a 16 to 1 Multiplexer (MUX) 66, which is controlled by the four address/data inputs Addr/Data 64a through 64d, the state of which is dependent upon a function currently being performed and the current context, to select a single one of the 16 configuration bits available in the current configuration.

As stated and described above, PLU 40 is implemented as a truth table memory in the presently preferred embodiment. It will be appreciated by those of ordinary skill in the relevant arts, however, that as described above PLU 40 is functionally a programmable logic unit for performing programmable logic functions, including both logical and mathematical operations, and that PLU 40 may be implemented in any of a variety of forms, such as a programmable logic device or a microprogrammed logic unit, rather than a truth table.

The functions performed by PLU 40 are unique in each context and, in the present embodiment of PLU 40 as a truth table, are specified in a configuration bitstream that, as described, is provided to CSLCs 20 and stored in PLU 40 as CSBits 42, thereby implementing a programmable function defined by the configuration bits of each CSBit 42.

It will be noted that PLU 40 is not used as a memory element for storing data, but instead stores only CSBits 42. Instead, and as described above, each CSLC 20 includes a CSRam 44 for storing data and which, as described in a following discussion, is used to implement global sharing of data, which is similar in certain respects to traditional blackboard data sharing.

As shown in FIG. 5a, Inputs 68a through 68d of CSRam 44 are connected from the Addr/Data 64a through 64d inputs of PLU 40, thereby utilizing the same input/output pin connections, and the data output of CSRam 44 is, as described, connected to an input of MUX 50. In contrast to PLU 40, CSRam 44 does not receive data inputs from Carry 54, but instead receives data from Inputs 34 of the CSLC 20, so that the four Inputs 68 are used for both data and addressing. For this reason, and in the presently preferred embodiment, three of Inputs 68 are used as address input lines and one of Inputs 68 is used as a data input line and CS Ram 44 corresponding has a capacity for storing 8 single data bits.

As mentioned above, CSRam 44 implements a global data sharing scheme and, accordingly, any data written into a CSRam 44 is available to all other CSRams 44 that are physically collocated among the different contexts. Therefore, whatever data value is last written into the active CSRam 44 before deactivation of a current context will be seen and available to all other collocated CSRams 44 upon the activation of their respective contexts. In this respect, CSRams 44 allows large amounts of data to be passed between contexts, thereby facilitating certain modes of computation, such as the previously discussed moving of an algorithm through the data, rather than moving the data through an algorithm. This mode of computation is advantageous because the on/off chip accesses are minimized by loading the data onto the chip and retaining the data on the chip until the entire algorithm has been run on the data. CSRams 44 also permit, for example, the contents written into the CSRams 44 during one context being read from the CSRams 44 and used as CSBits 42 during another context, thereby allowing CSRams 44 to be utilized as a context to context dynamic PLU 40.

Referring now to CSR 48, in the present embodiment as shown in the block diagram of FIG. 5c CSR 48 is comprised of seven flip-flops that are addressed by means of the CSLC 20 input lines associated with PLU 40 and designated as Addr/Data 56a through 56d. In this regard, it will be understood by those of ordinary skill in the relevant arts that CSR 48 is implemented in the present embodiment in the form of flip-flops because in the present implementation each CSLC 20 is a single bit logic element. In other embodiments, CSLC 20 may be a multiple bit logic element and CSR 48, PLU 40, CSRam 44 and the various buses of the logic cells, arrays and pipelines will be expanded accordingly. As such, it will be understood that CSR 48 and the elements comprising CSR 48 function as registers for storing data and may be implemented in a variety of different types of memory or data storage elements, depending upon the number of bits operated upon by each CSLC 20.

Of the seven registers, that is, flip-flops, comprising CSR 48 in the present embodiment, the four registers designated as CSR 48*a*, 48*b*, 48*c* and 48*d* are "private" registers addressable only within a corresponding context. The two registers designated as CSR 48*e* and 48*f* are public registers accessible by all contexts, and the single register designated as CSR 48*g* is the currently active register that is used to latch the outputs of PLU 40 or CSRam 44 during the execution of each context and, in the present embodiment, operates as a conventional D type flip-flop. The use of CSRs 48 is controlled by two context inputs, designated as Present 70*a* and Next 70*b*, which are comprised of the CSBits 42 for the present and next contexts, and a Switch 70*c* signal that indicates the execution of a context switch. The present and next context identification inputs are stored in three registers, designated as Save 72*a*, Save To 72*b* and Load From 72*c*, whose outputs to public registers 48*e* and 48*f* indicate the contexts to which or from which the contents of CSR 48*g*, the currently active CSR 48 register, are to be saved or loaded from. The Present 70*a* and Next 70*b* inputs are used directly to control operations with respect to private registers CSRs 48*a* through 48*d* and active register 48*g* and the routing of public and private data among the CSR 48 registers is controlled by appropriate logic and buses, which will be readily understood by those or ordinary skill in the relevant arts and are represented generally in FIG. 5*c* by Routing Logic (RL) 72*d* and the generalized input/output buses illustrated as interconnecting the active and public registers and R 72*d*.

Referring finally to Carry 58, Carry 58 is capable of generating carrybits for both addition and subtraction operations and, as described previously, CSBits 42 are distributed to LUTs 40 through the carry chain. The carry output of each Carry 58 is dependent upon the data inputs of each CSLC 20 and the function to be executed by each CSLC 20 and, for this reason and as indicated in FIG. 5*a*, Carry 58 is connected at the inputs of PLU 40. As has also been described, the carry chain between CSLCs 20 and between CSLAs 14 is connected through dedicated connections. The carry chain can be connected, disconnected, or, in the present implementation, may be fed a logic 0 or a logic 1 every four bits. In this manner, the bus routing mode, which was described above, can be utilized to generate a pipeline granularity of four bits and, in fact, the bus widths can be of any arbitrary bitwidth n. In addition, and as described above, the carry chain and the bus routing mode are used to distribute the configuration bitstream to CSLCs 20 and, for this purpose, outputs of Carry 58 are provided as inputs to PLU 40.

D. Context Switching Input/Output Cells (CSIOs) 74 (FIG. 6)

In order to facilitate on and off chip data accesses, CSLAs 14 are provided with a Context Switching Input/Output Cell (CSIOs) 74 at each connection between a line of a Level 1 Bus 22, which interconnect the CSLCs 20 of a CSLA 14, and a line of a Level 2 Bus 16, which interconnect CSLAs 14 and to a Level 3 Bus 18, if any. It will be noted that the Level 1 Bus 22 to Level 2 Bus 16 interconnections are illustrated in FIGS. 3 and 4, but CSIOs 74 are not explicitly represented therein in order to illustrate the bus interconnections more clearly.

Figure 6:
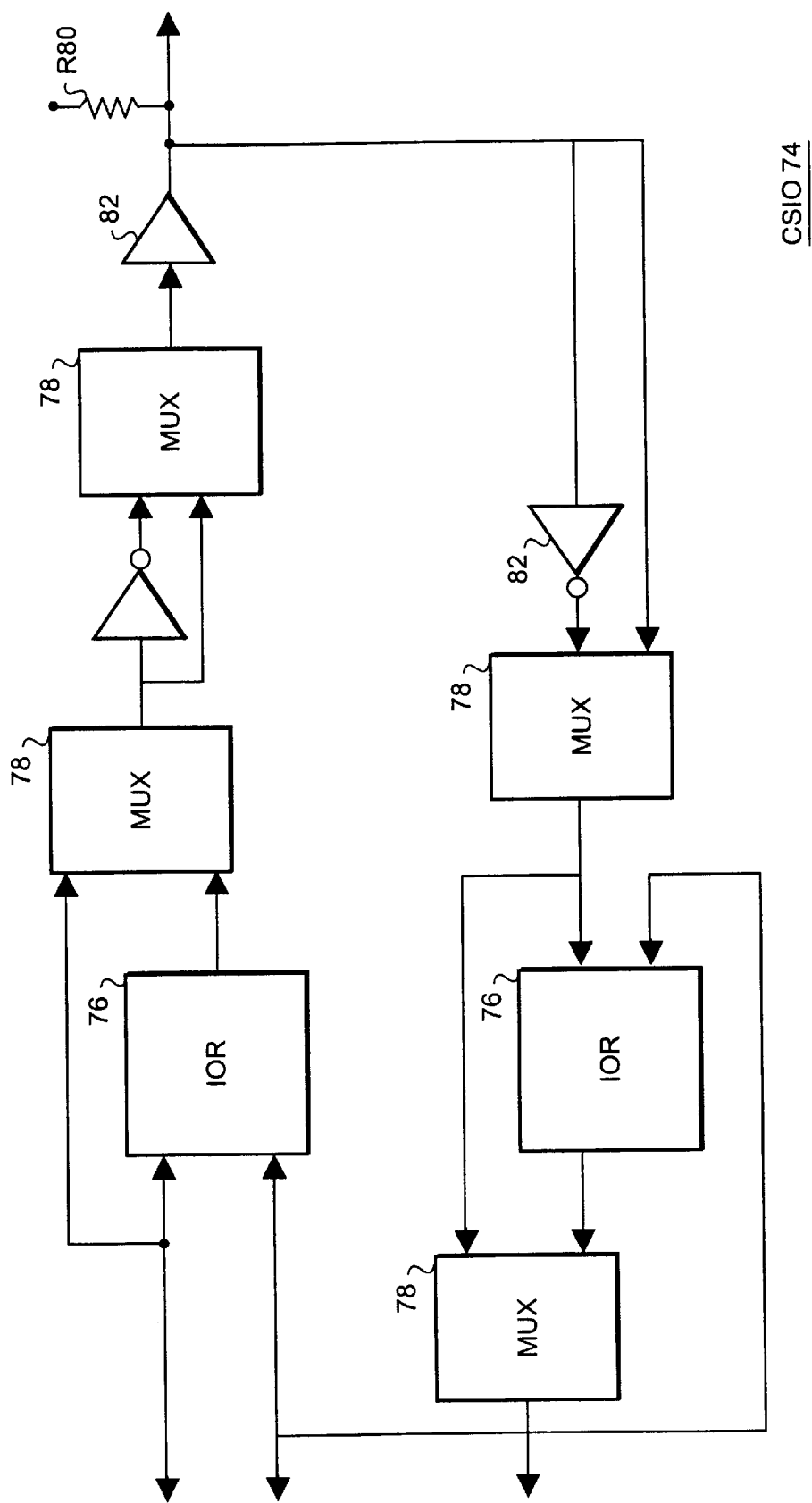
FIG. 6 is a block diagram of a input/output element for use with the logic cells of the present invention.

As shown in FIG. 6, each CSIO 74 is bidirectional and provides both direct and latched outputs by means of Input/Output Registers (IORs) 76, which are implemented as flip-flops in the present embodiment, and Multiplexers (MUXs) 78. Each CSIO 74 further includes a programmable pull-up resistor, designated as R 80, and an output Tri-State Driver 82.

Finally, and as will be discussed further below, IORs 76 may be utilized for global data sharing, in addition to CSRams 44.

E. Data Sharing and Context Switching

As has been discussed previously, the object of the CSLCs 20 and CSLAs 14 of the present invention are to provided a context switching system wherein contexts may be switched rapidly, and in real time, and to allow the sharing of data among contexts. For this reason, the present invention as described herein above provides two data sharing schemes, which are referred to as Global Sharing and Private/Public Addressable Sharing (P/PASS). As has been discussed above, Global Sharing is the provision of a common memory element that is accessible by all contexts, and in the present embodiment is implemented through CSRam 44 and, if desired, through IORs 76. All contexts may view and access these memory elements, and when any context writes data to any of these global sharing memory elements, the change and the data is visible and accessible by all contexts upon their activation.

In P/PASS data sharing, each CSR 48 within each context, that is, each existence of CSR 48*g* in each context, has a corresponding register, a corresponding one of CSRs 48*a* through 48*d*, which are referred to herein as private registers as they may be accessed only within the corresponding context. As described, there is a single active CSR 48 register, CSR 48*g*, in each context and this active register is the CSR 48 register that is actually utilized during the execution of each context. Upon switching contexts, the contents of the outgoing instantiation of the active register, which may be intermediate results, are saved to the outgoing context's private register, that is, the corresponding one of CSRs 48*a* through 48*d* wherein that CSR 48 private register is accessible only by that context. It should be noted, in this regard, that this feature may be used to implement a system having secure kernels by providing a means for isolating intermediate data.

In addition, a context can direct that its values can be written to a public CSR 48 register, that is, CSR 48*e* or 48*f*, which can be addressed by all other contexts, so that CSRs 48*e* and 48*f* comprised a part of the global sharing scheme. It should be noted that the number of public registers in any given P/PASS embodiment is independent of the number of contexts actually supported by the hardware, and that public registers must be addressed when used as there is no fixed relationship between any public register and any context.

Finally, it should be noted that upon activation a context can direct that its previous state be restored by reading from its corresponding private register, or that its state be loaded from a public register, which is done on a CSLC 20 by CSLC 20 basis.

It will be apparent from the above that P/PASS data sharing provides a means to keep secure data isolated within a given context, by users of private registers, while at the same time allowing data to be shared among contexts, if desired, by use of public registers. It will also be noted that the architecture of the present invention scales to implementations having more contexts than hardware support elements, allows sharing of data between contexts that do not necessarily follow one another in time, and allows the addition of features such as interrupt handling and hardware recursion.

In addition, the architecture of the present invention allows rapid reconfiguration, within a single clock cycle, which is desirable in applications such as virtual coprocessors. It should be noted that the reconfiguration capability of the present architecture includes not only reconfiguring the system hardware and its functions, but execution of the data sharing schemes. In the present implementation, an active context can be switched sufficiently rapidly that a context can be processing data on one clock edge, switch to a new configuration, including data sharing, and begin processing data in a new configuration on the next clock edge. It should be noted that a limitation on rapid context switching is the time required to distribute the "switch to" lines through the hardware, but this delay is merely a latency and can be factored into the logic that initiates context switches.

F. Programming

It will be apparent from the above discussions that the configuration bitstreams for the CSLAs 14 and CSLCs 20 are downloaded serially, that a user is required to specify which context is to be downloaded and to provide a clock and data, and that by repeating this process four times, a user can configure all four of the available on-chip configurations. It should be noted that a configuration being downloaded cannot be active during the download while another context is active and running. Inactive contexts, however, can be downloaded while another context is running. In addition, a configuration bitstream can be downloaded by the active context. This in turn allows the passing of compressed or encrypted configuration bitstreams into the active context, so that it may download an inactive context after decompressing or decrypting the compressed or encrypted bitstream. Finally, it is generally preferable that the system power up, prior to downloading configuration bitstreams, in a known state, thereby allowing a user to determine that the system is operational prior to use. This initial state will generally be benign, and may provide some degree of self testing.

In conclusion, while the invention has been particularly shown and described with reference to preferred embodiments of the apparatus and methods thereof, it will be also understood by those of ordinary skill in the art that various changes, variations and modifications in form, details and implementation may be made therein without departing from the spirit and scope of the invention as defined by the appended claims. For example, the number of data and address input lines of each CSLC 20 may be varied according to the needs of a system and the capacities of PLU 40 and CSRam 44 and the number of public and private registers 48 may be increased or decreased as necessary, for example, to accommodate greater numbers of contexts. In a like manner, the number of CSLCs 20 in a CSLA 14 may be increased or decreased to provide wider or narrower pipelines, or arranged to sub-divide a pipeline or CSLA 14 as desired, and the widths of Level 1 Bus 22, Level 2 Bus 16 and Level 3 Bus 18 may be increased or decreased in the same manner. In addition, CSLAs 14 may be provided with additional Level 2 Buses 16 or a System 10 provided with additional Level 3 Buses 18, depending upon the desired organizations of CSLAs 14 and pipelines in a system and the system may select among the various Level 2 Buses 16 and Level 3 Buses 18 by, for example, the user of tri-state drivers. Also, and for example, additional memory, such as random access memories in any desired capacity, may be connected from a Level 2 Bus 16 or from a Level 3 Bus 18 and such additional memory may be partitioned as public or context private memory spaces as desired in the same manner as CSRs 48 are allocated to public or private use.

What is claimed is:

1. A context switching logic cell with data sharing for use in a context switching system, comprising:
   a programmable logic unit connected from an address/data input for implementing at least one programmable logic function for a corresponding context,
   a context memory connected from the function control memory and including a plurality of registers for storing and providing as an output the results of context dependent logic operations, the plurality of registers including
      a plurality of private registers, each private register corresponding to a context and being addressable only within the corresponding context for storing and providing as outputs the results of logic operation in the corresponding contexts,
      at least one public register addressable within all contexts for storing and providing as outputs the results of logic operations within all contexts, and
      an active register for storing and providing as an output the results of logic operations for a current context, and
   carry logic for receiving a carry bit and generating a carry bit output dependent upon the received carry bit and a current logic operation.

2. The context switching logic cell of claim 1, further comprising:
   a data memory having an address/data input and accessible within all contexts for receiving and storing data and providing a data output to the active register.

3. The context switching logic cell of claim 1, wherein the context memory further comprises:
   register control logic for receiving designations of a present context and a next context and proving register control outputs selecting the private, public and active registers to receive or to provide results of a logic operation.

4. The context switching logic cell of claim 1, wherein the programmable logic unit comprises:
   a function control memory connected from an address/data input for storing a plurality of sets of configuration bits, each set of configuration bits corresponding to one of a corresponding plurality of contexts and implementing at least one programmable logic function for the corresponding context.

5. A context switching logic array with data sharing for use in a context switching system, comprising:
   a plurality of context switching logic cells arranged in parallel to perform n bit logic operations wherein n is the number of context switching logic cells in the context switching logic array, each context switching logic cell including
      a programmable logic unit connected from an address/data input for implementing at least one programmable logic function for a corresponding context,
      a context memory connected from the function control memory and including a plurality of registers for storing and providing as an output the results of context dependent logic operations, the plurality of registers including a plurality of private registers, each private register corresponding to a context and being addressable only within the corresponding context for storing and providing as outputs the results of logic operation in the corresponding contexts, at least one public register addressable within all contexts for storing and providing as outputs the results of logic operations within all contexts, and an active register for storing and providing as an output the results of logic operations for a current context, carry logic for receiving a carry bit and generating a carry bit output dependent upon the received carry bit and a current logic operation, a first level bus for interconnecting the address/data inputs and result outputs of the plurality of context switching logic cells into the context switching logic array for performing n bit logic operations and providing address/data inputs and result outputs of the context switching logic array, and dedicated carry lines for and corresponding to each context switching logic cell for communicating carry bits between the context switching logic cells.

6. The context switching logic array of claim 5, wherein each context switching logic cell further comprises:

a data memory having an address/data input connected from the first level bus and accessible within all contexts for receiving and storing data and providing a data output to the active register.

7. A context switching pipeline with data sharing for use in a context switching system, comprising:

a plurality of context switching logic arrays arranged in series to perform n bit pipelined operations, each context switching logic array including a plurality of context switching logic cells arranged in parallel to perform n bit logic operations wherein n is the number of context switching logic cells in the context switching logic array, each context switching logic cell including a programmable logic unit connected from an address/data input for implementing at least one programmable logic function for a corresponding context, a context memory connected from the function control memory and including a plurality of registers for storing and providing as an output the results of context dependent logic operations, the plurality of registers including a plurality of private registers, each private register corresponding to a context and being addressable only within the corresponding context for storing and providing as outputs the results of logic operation in the corresponding contexts, at least one public register addressable within all contexts for storing and providing as outputs the results of logic operations within all contexts, and an active register for storing and providing as an output the results of logic operations for a current context, carry logic for receiving a carry bit and generating a carry bit output dependent upon the received carry bit and a current logic operation, a first level bus for interconnecting the address/data inputs and result outputs of the plurality of context switching logic cells into the context switching logic array and providing address/data inputs and result outputs of the context switching logic array, and dedicated carry lines for and corresponding to each context switching logic cell for communicating carry bits between the context switching logic cells, and for each context switching logic cell in the context switching array, first and second output interconnections for providing a corresponding output of a corresponding context switching logic cell to inputs of corresponding context switching logic cells in sequentially adjacent context switching logic arrays, and a second level bus for interconnecting the address/data inputs and result outputs of the plurality of context switching logic arrays into the context switching pipeline and providing address/data inputs and result outputs of the context switching pipeline.

8. The context switching pipeline of claim 7, wherein each context switching logic cell further comprises:

a data memory having an address/data input connected from the first level bus and accessible within all contexts for receiving and storing data and a data output to the active register.

9. A context switching system with data sharing, comprising:

a plurality of context switching pipelines arranged in parallel, each context switching pipeline including a plurality of context switching logic arrays arranged in series to perform n bit pipelined operations, each context switching logic array including a plurality of context switching logic cells arranged in parallel to perform n bit logic operations wherein n is the number of context switching logic cells in the context switching logic array, each context switching logic cell including a programmable logic unit connected from an address/data input for implementing at least one programmable logic function for a corresponding context, a context memory connected from the function control memory and including a plurality of registers for storing and providing as an output the results of context dependent logic operations, the plurality of registers including a plurality of private registers, each private register corresponding to a context and being addressable only within the corresponding context for storing and providing as outputs the results of logic operation in the corresponding contexts, at least one public register addressable within all contexts for storing and providing as outputs the results of logic operations within all contexts, and an active register for storing and providing as an output the results of logic operations for a current context, carry logic for receiving a carry bit and generating a carry bit output dependent upon the received carry bit and a current logic operation, a first level bus for interconnecting the address/data inputs and result outputs of the plurality of context switching logic cells into the context switching logic array and providing address/data inputs and result outputs of the context switching logic array, and dedicated carry lines for and corresponding to each context switching logic cell for communicating carry bits between the context switching logic cells, for each context switching logic cell in the context switching array, first and second output interconnections for providing a corresponding output of a corresponding context switching logic cell to inputs of corresponding context switching logic cells in sequentially adjacent context switching logic arrays, and a second level bus for interconnecting the address/data inputs and result outputs of the plurality of context switching logic arrays into the context switching pipeline and providing address/data inputs and result outputs of the context switching pipeline, and a third level bus for interconnecting the second level buses of the context switching pipelines, and dedicated carry lines for and corresponding to each context switching logic array for communicating carry bits between the corresponding context switching logic arrays of adjacent context switching pipelines.

10. The context switching system of claim 9, wherein each context switching logic cell further comprises:

a data memory having an address/data input connected from the first level bus and accessible within all contexts for receiving and storing data and a data output to the active register.

* * * * *

UNITED STATES PATENT AND TRADEMARK OFFICE
CERTIFICATE OF CORRECTION

| | | |
|---|---|---|
| PATENT NO. | : 6,175,247 B1 | Page 1 of 1 |
| APPLICATION NO. | : 09/288892 | |
| DATED | : January 16, 2001 | |
| INVENTOR(S) | : Stephen M. Scalera et al. | |

It is certified that error appears in the above-identified patent and that said Letters Patent is hereby corrected as shown below:

On the Title Page,

Item (60), "Apr. 10, 1998" should read --Apr. 14, 1998--

Column 1, line 9, "Apr. 10, 1998" should read --Apr. 14, 1998--

Signed and Sealed this

Twelfth Day of April, 2011

David J. Kappos
*Director of the United States Patent and Trademark Office*